(12) United States Patent
Hendrix et al.

(10) Patent No.: US 10,492,332 B2
(45) Date of Patent: Nov. 26, 2019

(54) MODULAR ELECTRONICS ENCLOSURE

(71) Applicant: CommScope Technologies LLC, Hickory, NC (US)

(72) Inventors: Walter Mark Hendrix, Richardson, TX (US); Willis Frank James, Wylie, TX (US); Charles John Mann, Omaha, NE (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/057,359

(22) Filed: Aug. 7, 2018

(65) Prior Publication Data
US 2019/0053400 A1    Feb. 14, 2019

Related U.S. Application Data

(60) Provisional application No. 62/544,040, filed on Aug. 11, 2017.

(51) Int. Cl.
*H05K 7/20* (2006.01)
*H05K 7/18* (2006.01)

(52) U.S. Cl.
CPC ......... *H05K 7/20136* (2013.01); *H05K 7/186* (2013.01); *H05K 7/2059* (2013.01)

(58) Field of Classification Search
CPC ............. H05K 5/0217; H05K 7/20745; H05K 7/20736; H05K 5/0247; H05K 7/18;
(Continued)

(56) References Cited

U.S. PATENT DOCUMENTS 5,747,734 A * 5/1998 Kozlowski ............ H02B 1/305
174/37
6,163,454 A   12/2000 Strickler
(Continued)

FOREIGN PATENT DOCUMENTS

JP    2012510145    4/2012

OTHER PUBLICATIONS

Notification of Transmittal of the International Search Report and the Written Opinion of the International Searching Authority, or the Declaration corresponding to International Application No. PCT/US2018/045526 dated Nov. 28, 2018.

Primary Examiner — Mandeep S Buttar
(74) Attorney, Agent, or Firm — Myers Bigel, P.A.

(57) ABSTRACT

A modular enclosure includes a plurality of enclosure modules, each of the enclosure modules comprising a front wall, a rear wall opposite the front wall, and two opposed side walls that span the front and rear walls; the front, rear and side walls forming an cavity; an equipment rack within the interior cavity with electronic equipment mounted thereon; and an air containment barrier that extends between the side walls to limit air flow between a front portion of the interior cavity and a rear portion of the interior cavity. At least one of the side walls of each of the enclosure modules includes a removable side panel, the side panel including first and second air flow openings, wherein the first air flow opening is forward of the air containment barrier and the second air flow opening is rearward of the air containment opening. The enclosure modules are arranged in adjacent relationship, and wherein at least one removable side panel of a first enclosure module abuts a removable side panel of a second adjacent enclosure module. The modular enclosure also includes an air cooling system mounted to the side wall of a first endmost enclosure module and an exhaust system (Continued)

mounted to the side wall of an opposite second endmost enclosure module.

9 Claims, 9 Drawing Sheets

(58) Field of Classification Search
CPC ............. H05K 5/0234; H05K 7/20709; H05K 7/20754; H05K 7/1488; H05K 5/0004; H05K 7/1497; H05K 7/20145; H05K 7/14; H05K 7/1492; H05K 7/186; H05K 7/20136; H05K 7/20209; H05K 7/20381; G06F 1/20; G06F 1/16
USPC .............. 454/184, 237, 254; 312/236, 265.5, 312/351.1, 352; 361/690, 695, 679.46, 361/679.02, 694, 724
See application file for complete search history.

(56) References Cited

U.S. PATENT DOCUMENTS

| | | | |
|---|---|---|---|
| 2002/0140325 A1 | 10/2002 | Webster et al. | |
| 2005/0231915 A1 | 10/2005 | Keenan et al. | |
| 2009/0021907 A1* | 1/2009 | Mann ................ | H05K 7/20745 361/679.41 |

* cited by examiner

MODULAR ELECTRONICS ENCLOSURE

The present application claims priority from and the benefit of U.S. Provisional Patent Application No. 62/544,040, filed Aug. 11, 2017, the disclosure of which is hereby incorporated herein in its entirety.

FIELD OF THE INVENTION

The present invention relates generally to cabinets, and more specifically to electronics cabinets.

BACKGROUND

In wireless networks, Baseband Units (or BBU's) send and receive data to the transmit/receive radios typically deployed at cell sites. In more traditional networks, these BBUs are collocated at the cell site with the radios they serve. In newer network architectures, BBU's from multiple sites are 'pooled' into groups that are centrally located and serve multiple cell sites. This architecture is referred to as Cloud RAN, or C-RAN. FIG. 1 illustrates an exemplary C-RAN arrangement 300, which includes a central office 302, a C-RAN hub 304 that houses the BBUs, and a series of antenna towers 306 that are fed by the C-RAN hub 304 via fiber optic cables 308 (wherein one or more cabinets 310 may be present at each antenna tower 306).

The pooled BBUs housed in the C-RAN hub 304 mentioned above must be housed in an outdoor enclosure or building of some type. In particular, outdoor electronic cabinets have become popular in recent years. They can protect a wide range of electronic equipment including radios, multicarrier power amplifiers (MCPA), power supplies, batteries, and wireless cell site backhaul equipment. These cabinets can protect base station equipment from environmental conditions while minimizing operating expenses and energy consumption.

SUMMARY

As a first aspect, embodiments of the invention are directed to an enclosure module for an electronics enclosure. The module comprises: a front wall, a rear wall opposite the front wall, and two opposed side walls that span the front and rear walls; the front, rear and side walls forming an interior cavity; an equipment rack within the interior cavity with electronic equipment mounted thereon; and an air containment barrier that extends between the side walls to limit air flow between a front portion of the interior cavity and a rear portion of the interior cavity. At least one of the side walls has a removable panel. The removable panel includes first and second air flow openings, wherein the first air flow opening is forward of the air containment barrier and the second air flow opening is rearward of the air containment barrier.

As a second aspect, embodiments of the invention are directed to a modular enclosure comprising a plurality of enclosure modules. Each of the enclosure modules comprises: a front wall, a rear wall opposite the front wall, and two opposed side walls that span the front and rear walls; the front, rear and side walls forming an interior cavity; an equipment rack within the interior cavity with electronic equipment mounted thereon; and an air containment barrier that extends between the side walls to limit air flow between a front portion of the interior cavity and a rear portion of the interior cavity. At least one of the side walls of each of the enclosure modules includes a removable side panel, the side panel including first and second air flow openings, wherein the first air flow opening is forward of the air containment barrier and the second air flow opening is rearward of the air containment opening. The enclosure modules are arranged in adjacent relationship, wherein at least one removable side panel of a first enclosure module abuts a removable side panel of a second adjacent enclosure module. The enclosure further includes: an air cooling system mounted to the side wall of a first endmost enclosure module; and an exhaust system mounted to the side wall of an opposite second endmost enclosure module.

As a third aspect, embodiments of the invention are directed to a method of enhancing an electronics enclosure, comprising the steps of:
 (a) providing a modular electronics enclosure comprising at least one enclosure module, the modular enclosure including a first enclosure module having a first side panel on which an air cooling system is mounted, and a second enclosure module having a second side panel on which an exhaust system is mounted;
 (b) removing the second side panel;
 (c) replacing the second side panel with a third side panel having first and second air flow openings;
 (d) installing a third enclosure module adjacent the third side panel, the third enclosure module having a fourth side panel with third and fourth air flow openings, the third enclosure module further having a fifth side panel on which an exhaust system is mounted.

DETAILED DESCRIPTION

Figure 1:
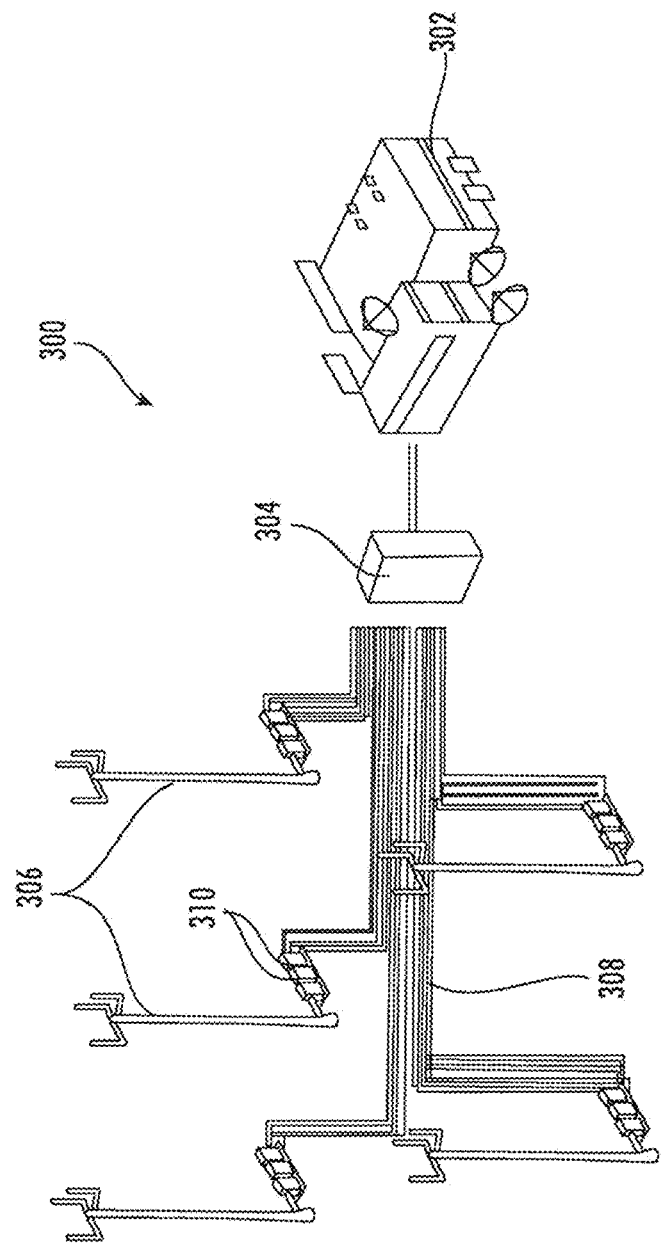
FIG. 1 is a schematic diagram of a typical C-RAN architecture.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

The C-RAN architectures discussed above are often deployed in areas with varying population density, which in turn dictates varied cell service needs. For example, in locales of lower population density, a smaller number of BBUs will be needed as there will be fewer cell sites, and the sites will typically have lower traffic capacity. However, over time it may be necessary to add additional capacity at these smaller sites. In contrast, in locations of high population density a larger number of BBU's will be required.

According to embodiments of the invention, one proposed approach to providing cabinets under varied circumstances involves the deployment of a modular enclosure that permits the deployment of additional enclosure modules as needed. By making the total solution and the enclosure modular, it is possible to scale the offered solution to meet varying BBU demands. In some embodiments, a base configuration of one or more enclosure modules can support initial requirements for a specific site. Each enclosure module may contain one equipment rack. This base configuration is designed to be capable of accepting additional 'add on' enclosure modules that attach, seal, and can be cooled along with the base configuration equipment. This field attachment of additional enclosure modules can be designed for rapid "plug and play" installation.

The BBUs within a cabinet or enclosure generate significant amounts of heat, so a cooling system is needed to support the cabinet. In some embodiments, the cooling system supports the modular nature of the enclosure design and is scalable such that cooling capacity can adjust to a range of heat loads. It may also be desirable that the cooling system achieve one or more of the following:

Minimize energy consumption for cooling

Require maintenance/servicing only once every 5 years

Operate at an acoustic noise level of 65 dBA or less as measured 5 feet from the enclosure Modularity and scalability, or the ability to provide cooling to added rack modules A controller that governs operation over a range of conditions and heat loads A controller that can be accessed and manipulated remotely In addition, the individual rack heat loads may vary. The system may provide capability for dynamic adjustment of cooling air flow to each rack. This may include temperature sensors that provide feedback to the cooling system controller, which then in turns adjusts air flow throughout the system.

Figure 2:
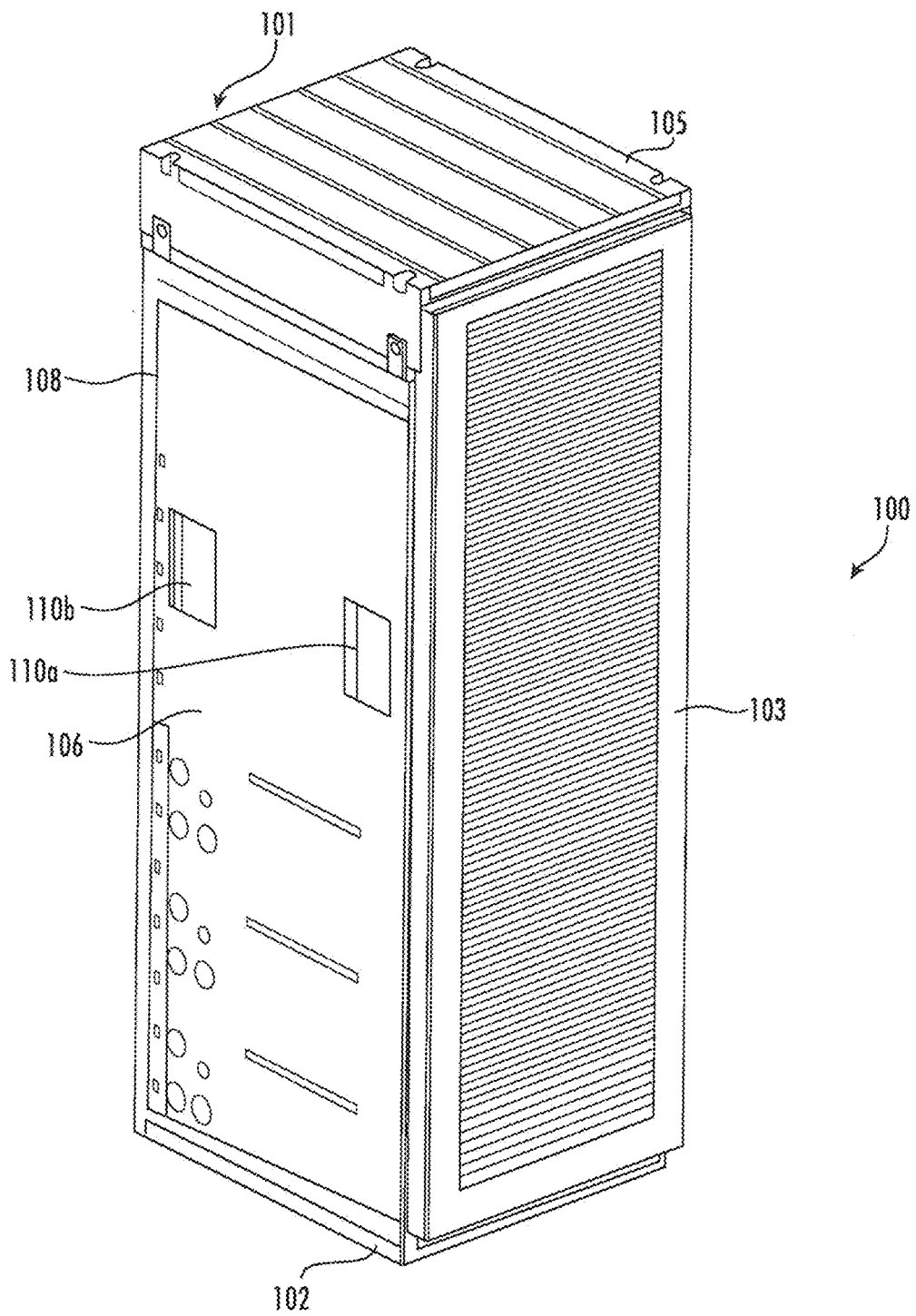
FIG. 2 is a front, left side perspective view of an electronics enclosure module according to embodiments of the invention.
Figure 3:
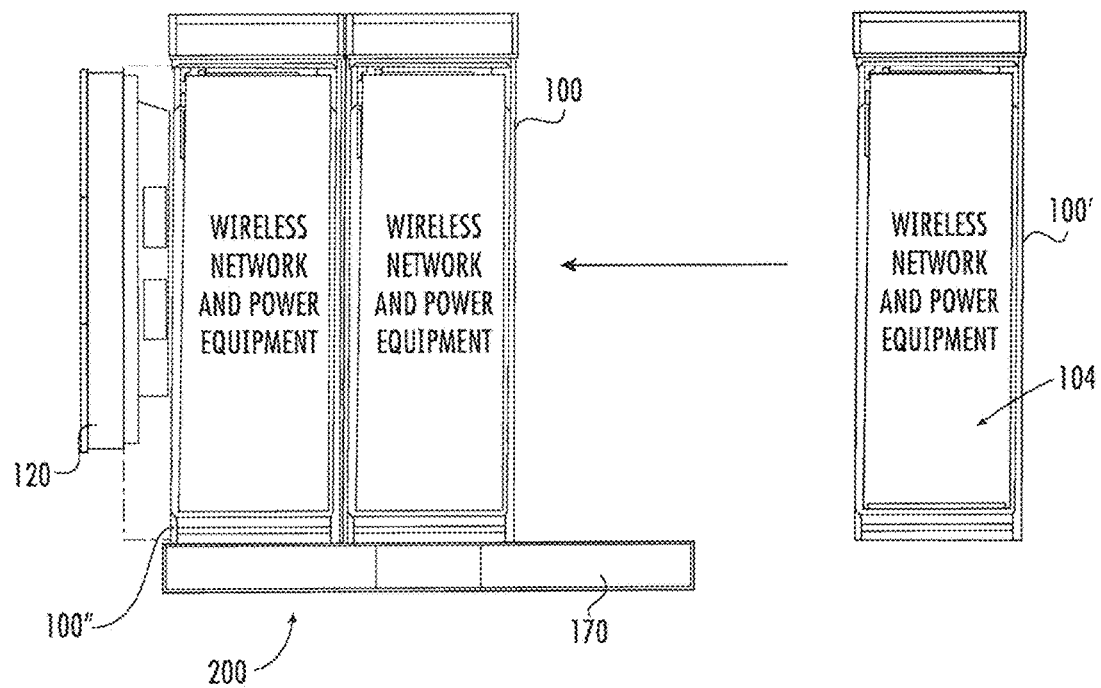
FIG. 3 is a front view of the enclosure module of FIG. 2 showing how it can be added to two similar modules to form an overall modular enclosure.
Figure 4:
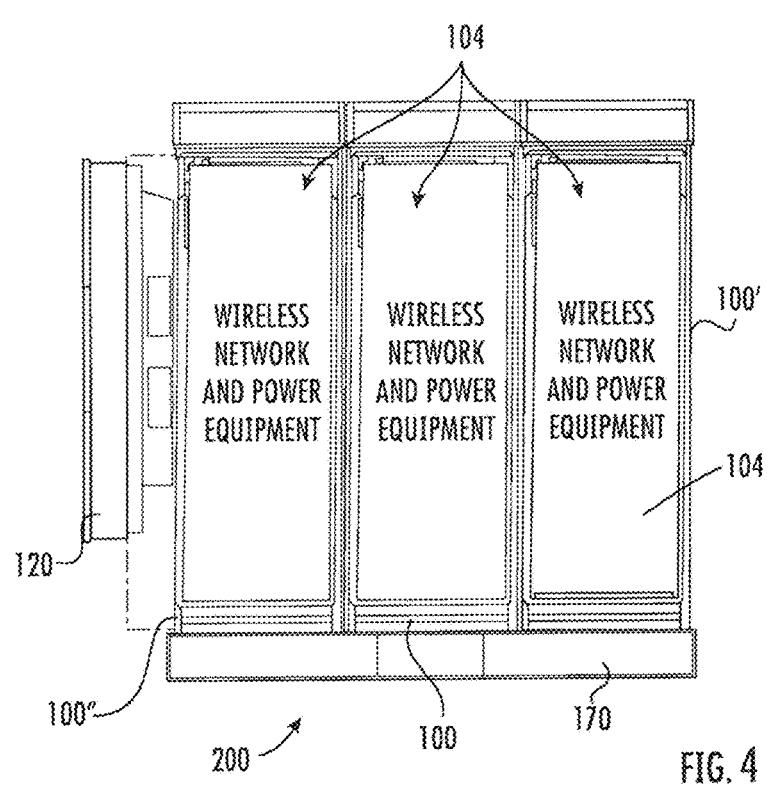
FIG. 4 is a front view of the modular enclosure assembly of FIG. 3 with all three modules in place.

Referring now to the figures, FIG. 2 illustrates an enclosure module 100 for a modular enclosure. As can be seen in FIGS. 3 and 4, multiple enclosure modules 100, 100', 100" can be joined to form an overall modular enclosure 200.

Figure 5:
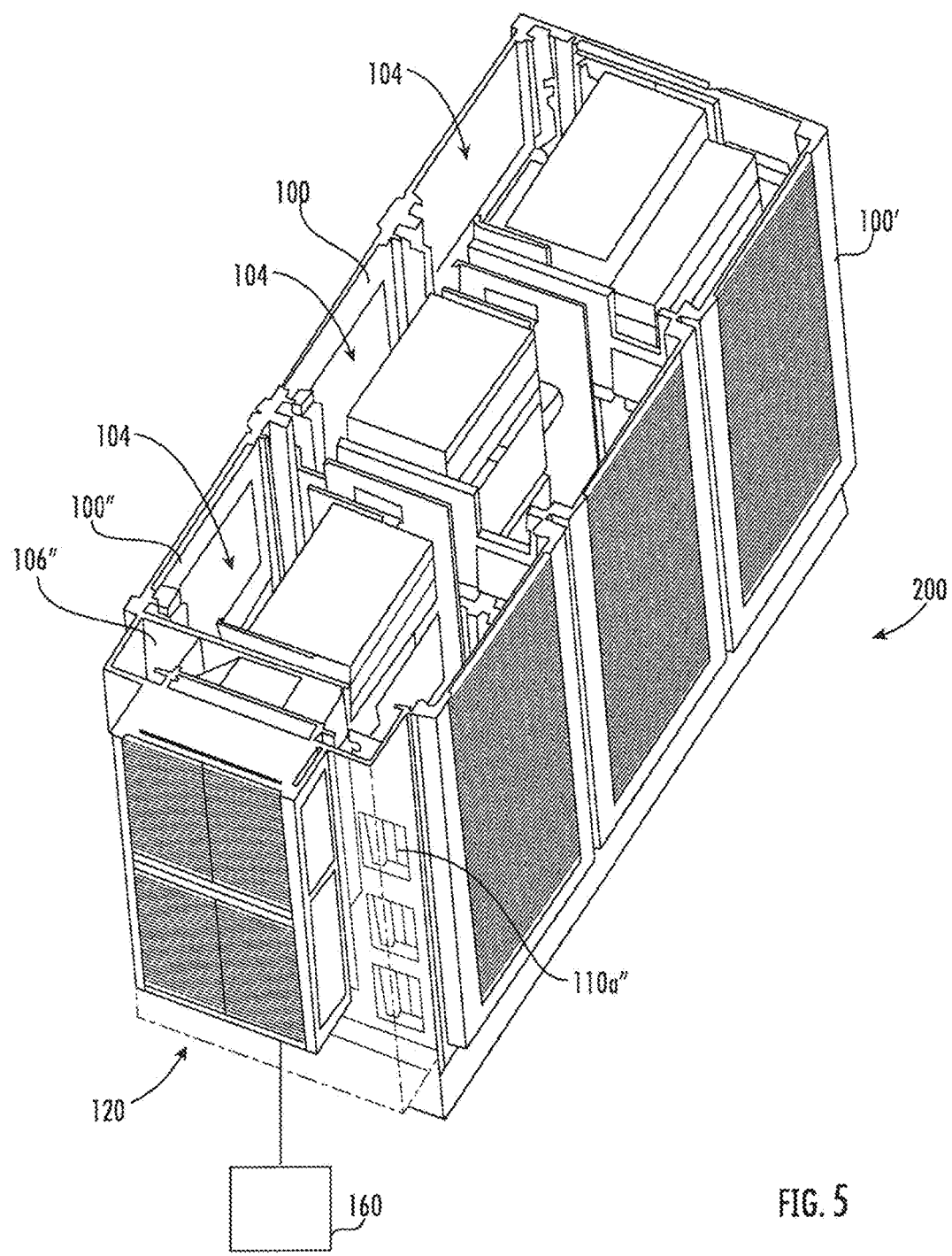
FIG. 5 is a top, left side perspective view of the modular enclosure of FIG. 4 with the ceilings removed to show the electronics stored therein.
Figure 6:
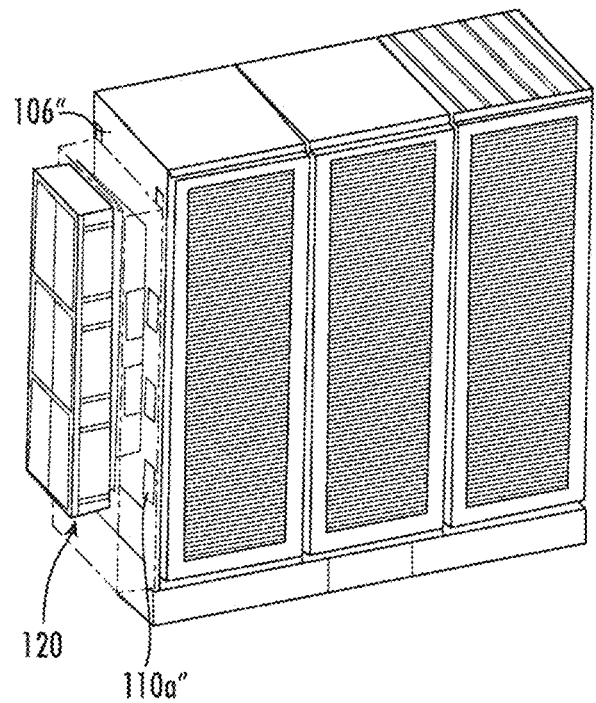
FIG. 6 is a front, left side perspective view of the modular enclosure of FIG. 4.

Referring back to FIG. 2, the enclosure module 100 is generally rectangular and box-shaped, with a rear wall 101, two side walls 102, a front wall 103, and a ceiling 105. These structures define an interior cavity 104. As can be seen in FIGS. 3-5, the interior cavity 104 is filled with electronic equipment and accessories. Examples of such equipment/ accessories include radios, multicarrier power amplifiers (MCPA), power supplies, batteries, and wireless cell site backhaul equipment.

The front wall 103 can be removed or, more commonly, can be attached as a door via a hinge on the side thereof to swing open and closed. In either instance, the front wall 103 is configured to allow selective access to the interior cavity 104.

The side walls 102 include removable side panels 106 that may be replaced with different configuration options. As shown in FIG. 2, one configuration for the side panels 106 is designed to mate with another adjacent or abutting side wall 106 of an adjoining enclosure module 100, and therefore includes a sealing gasket 108 near its perimeter. The sealing gasket 108 can seal against an adjacent side panel 106, either by sealing against a feature in the side panel 106 or a mating gasket 108. This configuration also includes openings 110a, 110b near opposite edges of the side panel 106 that serve to allow air to flow through the side panel 106. The side panel 106 is typically employed as an "internal" side panel disposed between adjacent enclosure modules.

Figure 7:
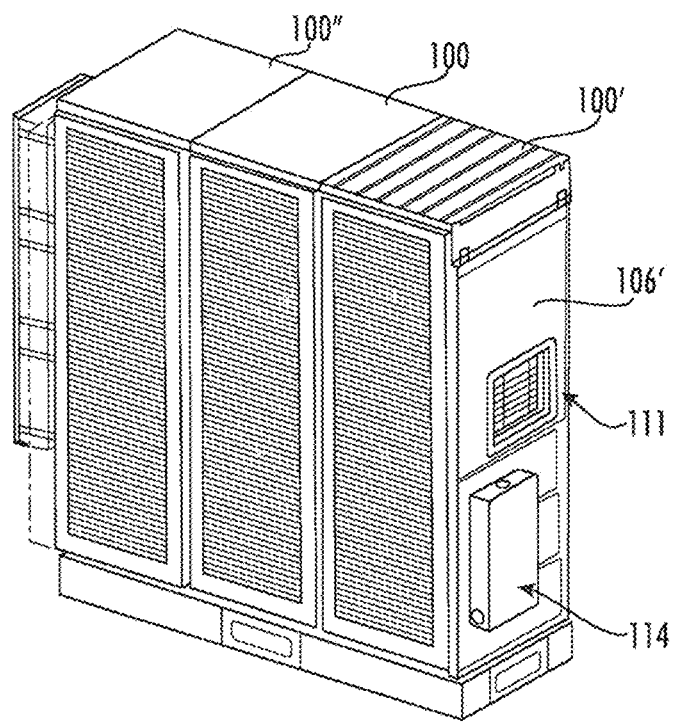
FIG. 7 is a front, right side view of the modular enclosure of FIG. 4.
Figure 9:
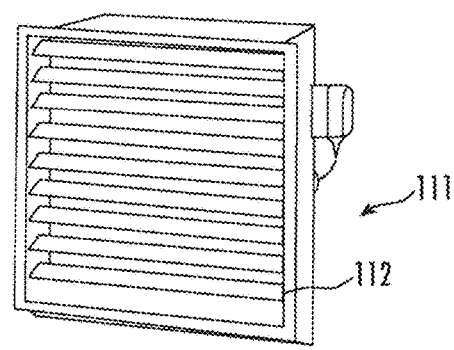
FIG. 9 is a perspective view of the exhaust louver of the modular enclosure of FIG. 4.

Another configuration for one of the side panels (designated at 106') can be seen in FIG. 7. This configuration, which is employed for one of the exterior side walls of the modular enclosure 200, includes a cooling exhaust system 111 that employs an adjustable louvered opening with louvers 112 (see also FIG. 9). The side panel 106' also includes an AC power input panel 114 to provide power to the modular enclosure 200 and the equipment therein.

Figure 8:
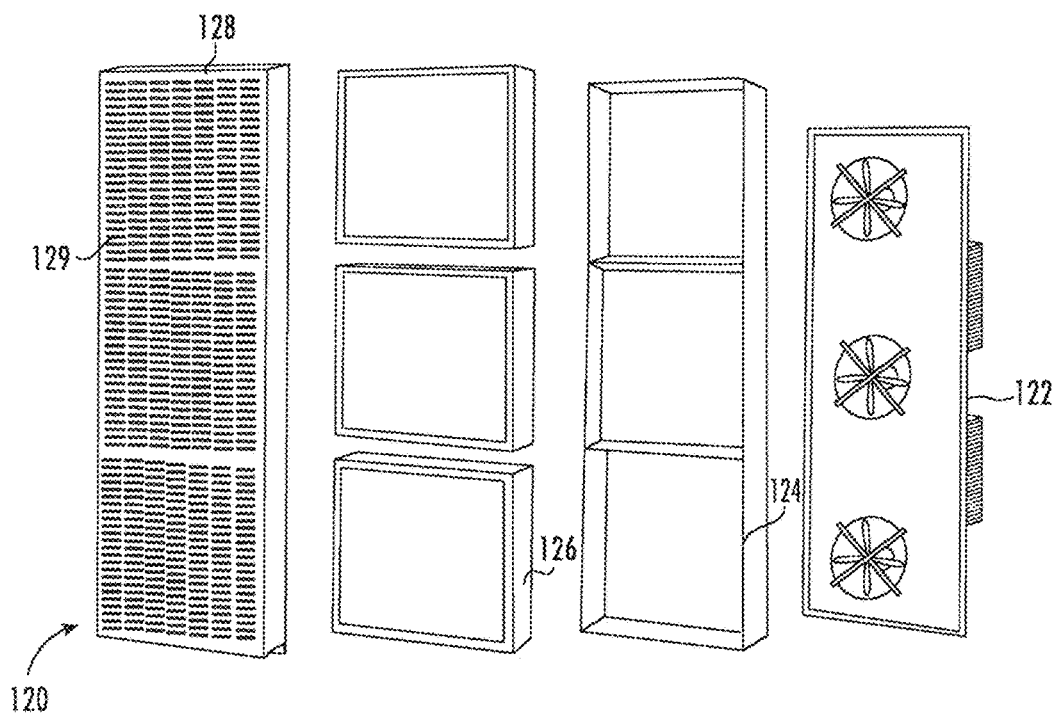
FIG. 8 is an exploded perspective view of the cooling system of the modular enclosure of FIG. 4.

A third configuration for the side panels (designated at 106"—see FIG. 5) is employed on the exterior side wall of the modular enclosure 200 opposite the side panel 106'. The side panel 106" is configured to provide a mounting location for a cooling system 120. The cooling system 120 includes a fan assembly 122, a filter holder 124, filters 126, and an outer cover 128 with vents 129 (FIG. 8). The cooling system 120 is mounted to the side panel 106" via a plenum box 140 (best seen in FIG. 10) that receives cooled air from the cooling system 120. The side panel 106" also includes an opening 110a" near one side edge to provide fluid communication from the plenum box 140 to the interior cavity 104 of the enclosure module 100 to which the cooling system 120 is mounted.

The cooling system 120 may be automatically controlled via a controller 160 (FIG. 5). The controller 160 is typically connected (either directly or wirelessly) to temperature sensors (not shown) within the interior cavities of the modules 100. Based on temperature readings from the sensors, the controller 160 may control one or more operating parameters of the cooling system 120; these may include activation/deactivation of one of the fans of the fan assembly 122, and/or adjusting the speed of the fans. In addition, the controller 160 may control flaps, doors, shutters, dampers or the like associated with the openings 110a, 110b in side panels 106 and/or the opening 110a" in the side panel 106" to adjust flow within specific enclosure modules 100 or even specific areas within enclosure modules 100. The controller 160 may also control the louvers of the louvered opening 112 to adjust their position and, in turn, regulate air flow. The controller 160 may be located within the cooling system 120, within one of the enclosure modules 100, 100', 100", or any other appropriate location.

As can be understood by reference to FIGS. 3 and 4, the modular enclosure 200 can be produced by employing one or more enclosure modules 100. If only a single enclosure module 100 is employed, the enclosure module 100 includes side wall 106" (with the cooling system attached thereto) and side panel 106'. If, as shown in FIG. 3, two enclosure modules 100, 100' are used, one enclosure module 100 has a side panel 106" and a side panel 106, and the other enclosure module 100' has a side panel 106 that abuts and seals against the side panel 106 of the first enclosure module 100, and also has a side panel 106'. If, as shown in FIG. 4, three enclosure modules 100, 100', 100" are employed, the enclosure module 100 includes a side panel 106' and a side panel 106, the enclosure module 100' (the center module) includes two side panel 106, and the enclosure module 100" includes a side panel 106 and a side panel 106". The side panels 106 of adjacent enclosure modules 100, 100', 100" abut and seal against each other.

As can also be understood from FIGS. 3 and 4, once one enclosure module 100 is installed, another enclosure module 100' can be added by simply replacing the side panel 106' of the first enclosure module 100 with a side panel 106, and installing the second enclosure module 100' with one side panel 106 that abuts the side panel 106 of the enclosure module 100 and a second side panel 106'. Similarly, a third enclosure module 100" can be added to the first two enclosure modules 100, 100' by replacing the side panel 106' of the enclosure module 100' with a side panel 106 and installing the third enclosure module 100" with a side panel 106 and a side panel 106'. More enclosure modules 100 may be similarly installed to increase the size of the modular enclosure 200. Thus, as a C-RAN architecture grows, thereby having the need for an enclosure that can house additional equipment, the modular enclosure 200 can grow with additional enclosure modules 100 as needed.

In some embodiments the enclosure modules 100 may be mounted on a base that has the capacity for multiple enclosure modules 100. As shown in FIG. 3, the base 170 illustrated therein can provide mounting locations for up to three enclosure modules 100, although the base 170 may be configured with more or fewer mounting locations. Also, in some embodiments the base 170 may be configured to be adjustable to accommodate different numbers of enclosure modules 100; for example, the base 170 may have "telescoping" rails that are able to extend or retract longitudinally as needed (depending on the number of enclosure modules 100 mounted thereon).

Figure 10:
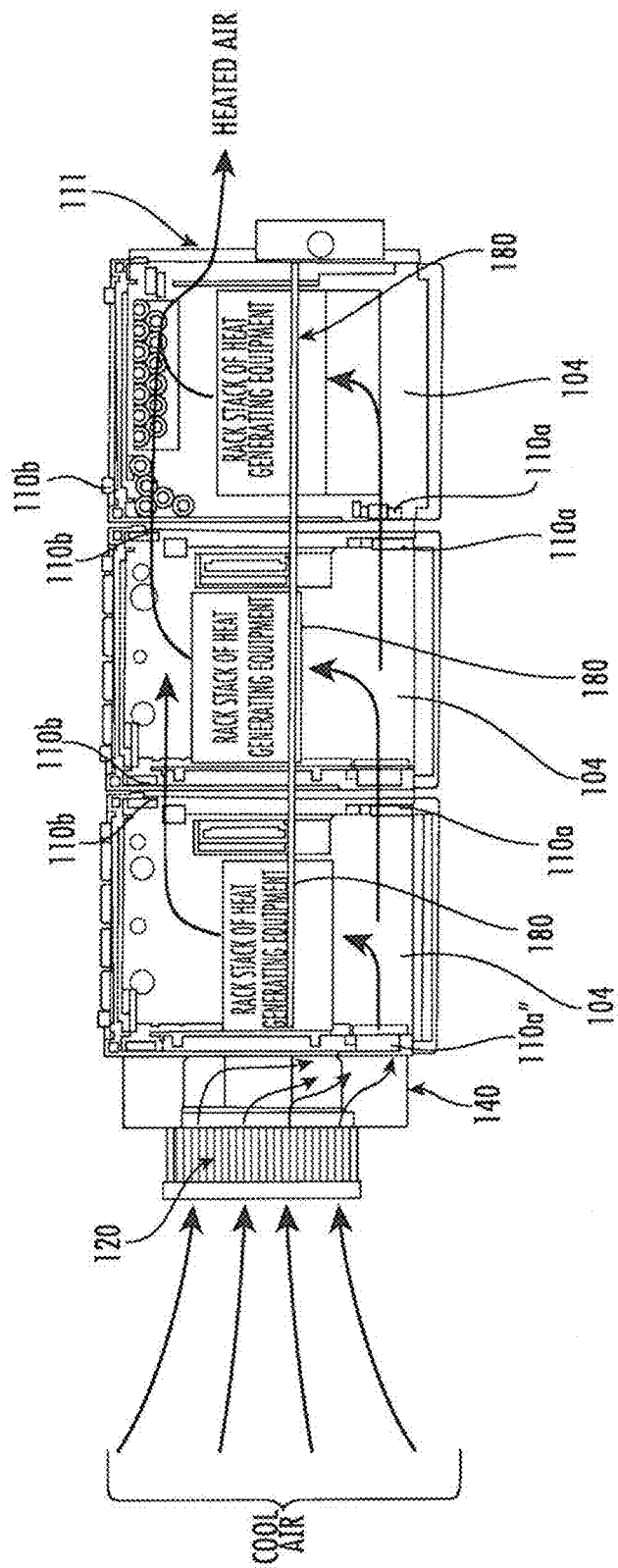
FIG. 10 is a top view of the modular enclosure of FIG. 4 with the ceilings removed to show schematically the air flow path from the cooling system to the exhaust louver.
Figure 11:
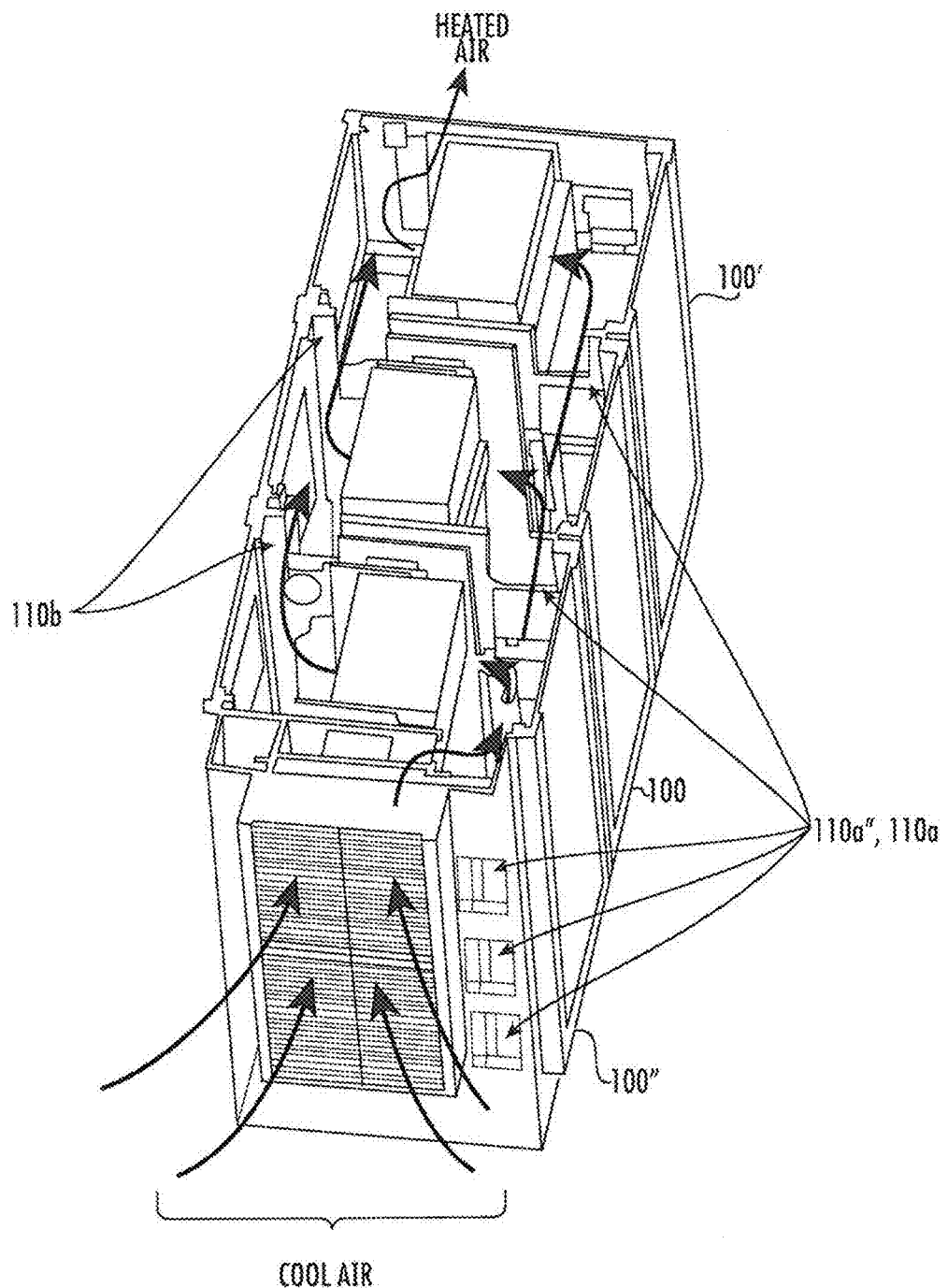
FIG. 11 is a top, left side perspective view of the modular enclosure of FIG. 4 showing the air flow path.

Referring to FIGS. 10 and 11, the air flow path of the modular enclosure 200 is illustrated. As can be seen in FIG. 10, each of the enclosure modules 100, 100', 100" includes an air containment barrier (shown at 180 in FIG. 10) that separates the front portion of the interior cavity 104 from the rear portion. As such, the openings 110a, 110b in each side panel 106 are separated by the air containment barrier 180. As a result, air flowing from the front portion of the cavity 104 of an enclosure module 100 flows over the electronic equipment mounted therein, thereby cooling the electronic equipment. Thus, the modular enclosure 200 defines an air flow path in which cool air from the cooling system 120 flows from the plenum box 140 through the opening 110a" and into the front portion of the modular enclosure 200. Some of the cooled air flows over heat-generating equipment in each enclosure module 100, 100', 100" and into the rear portion of the modular enclosure 200, then exits as heated air through the exhaust module 111. The air containment barrier 180 may take the form of one or more of walls, baffles, vanes or the like, and may be configured differently within different ones of the enclosure modules 100, 100', 100".

Those skilled in this art will appreciate that, although in FIG. 10 a single opening 110a" is shown in the side panel 106" and single openings 110a, 110b are shown in the side panels 106, these panels may include additional openings as needed. As discussed above, the openings 110a, 110b, 110a" typically include a flap, door, shutter, damper, etc. that enables the size of the opening to be adjusted (or even closed entirely, which may be desirable if more than one opening 110a or 110b is present on a single side panel 106.

Figure 12:
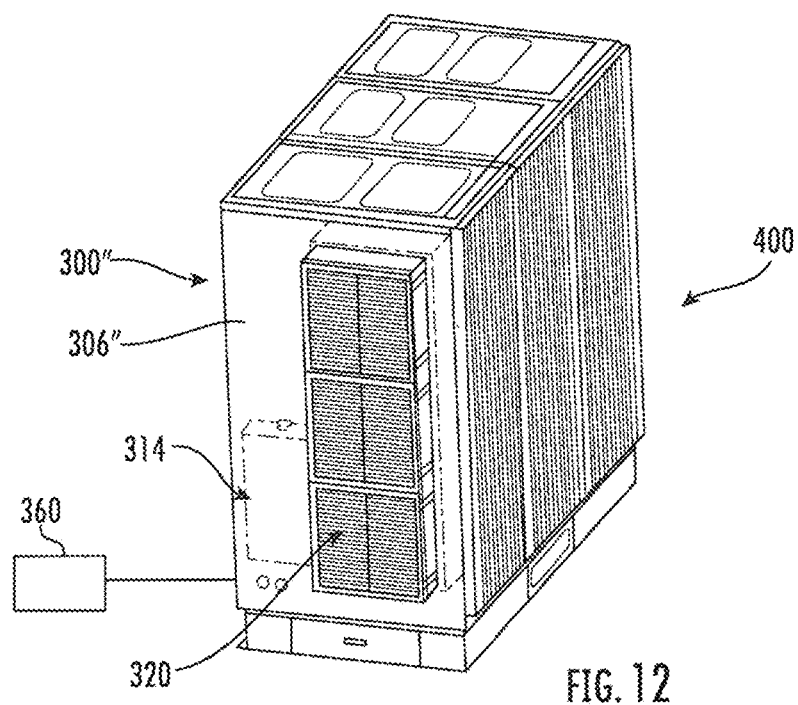
FIG. 12 is a front, left side perspective view of a modular enclosure assembly according to alternative embodiments of the invention.
Figure 13:
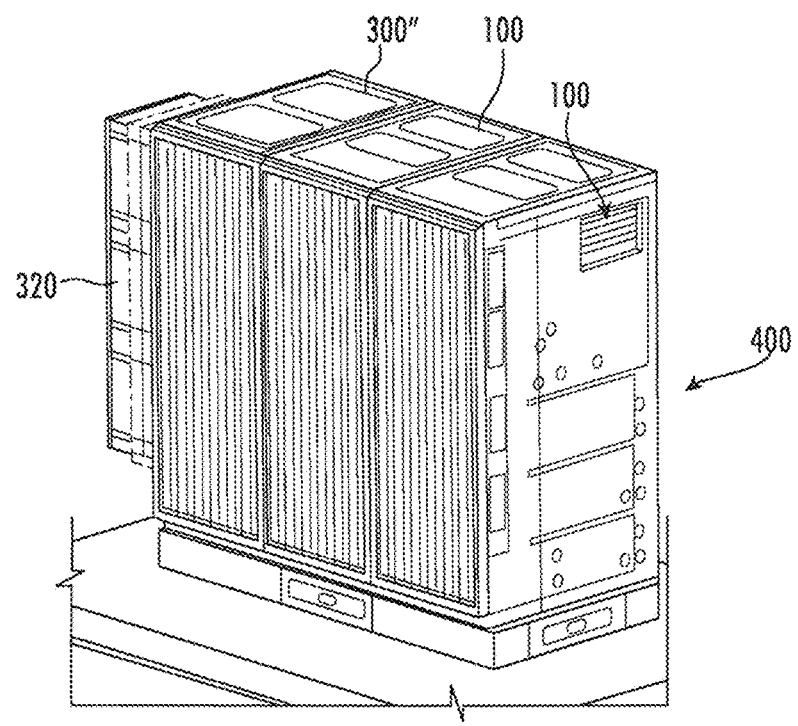
FIG. 13 is a front, right side perspective view of the modular enclosure of FIG. 12.

Referring now to FIGS. 12 and 13, another embodiment of a modular enclosure, designated broadly at 400, is shown therein. In this embodiment, an AC power input panel 314 is mounted on the same side panel 306" as the air cooling system 320 on the module 300". Such an arrangement may simplify expansion as additional modules 100 are added, as the module 300" could include permanent connections for the air cooling system 320, the power input panel 314, and the controller 360 that would not require reconnection as additional modules 100 are deployed.

Those skilled in this art will appreciate that the modular enclosure may take other forms. For example, although direct air cooling systems 120, 320 are shown herein, cooled air may also be provided by an air conditioner-based system, an economizer system or the like.

It should also be understood that, in some instances, the modules 100, 100', 100", 300" may be standalone cabinets that include openings in their abutting side walls (similar to the openings described above) to allow them to be cooled with a shared cooling system.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A modular enclosure, comprising:
    a plurality of enclosure modules, each of the enclosure modules comprising:
        a front wall, a rear wall opposite the front wall, and two opposed side wall that span the front and rear walls; the front, rear and side walls forming an interior cavity;
        an equipment rack within the interior cavity with electronic equipment mounted thereon; and
        an air containment barrier that extends between the side walls to limit air flow between a front portion of the interior cavity and a rear portion of the interior cavity;
        wherein at least one of the side walls of each of the enclosure modules includes a removable side panel, the side panel including first and second air flow openings, wherein the first air flow opening is forward of the air containment barrier and the second air flow opening is rearward of the air containment barrier;
    wherein the enclosure modules are arranged in adjacent relationship, and wherein at least one removable side panel of a first enclosure module abuts a removable side panel of a second adjacent enclosure module;
    an air cooling system mounted to the side wall of a first endmost enclosure module; and
    an exhaust system mounted to the side wall of an opposite second endmost enclosure module.

2. The modular enclosure defined in claim 1, wherein the air cooling system conveys air into the first endmost enclosure module through the first air flow opening in the side panel located forwardly of the air containment barrier, and wherein the exhaust system receives air from the second endmost enclosure module through the second air flow opening in the side wall rearwardly of the air, containment barrier.

3. The modular enclosure defined in claim 1, further comprising a common base on which the plurality of enclosure modules are mounted.

4. The modular enclosure defined in claim 3, wherein the common base is configured to be adjustable in size to accommodate different numbers of enclosure modules.

5. The modular enclosure defined in claim 1, further comprising a controller that is operatively connected with the air cooling system and the exhaust system.

6. The modular enclosure defined in claim 5, further comprising a plurality of temperature sensors operatively connected with the controller.

7. The modular enclosure defined in claim 1, wherein at least one of the first and second air flow openings includes a door configured to prevent or limit access through the air flow opening.

8. The modular enclosure defined in claim 7, further comprising a controller that is operatively connected with the air cooling system and the exhaust system.

9. The modular enclosure defined in claim 8, further comprising a plurality of temperature sensors operatively connected with the controller.

* * * * *

UNITED STATES PATENT AND TRADEMARK OFFICE
CERTIFICATE OF CORRECTION

PATENT NO. : 10,492,332 B2  
APPLICATION NO. : 16/057359  
DATED : November 26, 2019  
INVENTOR(S) : Hendrix et al.

Page 1 of 1

It is certified that error appears in the above-identified patent and that said Letters Patent is hereby corrected as shown below:

In the Claims

Column 7, Line 33, Claim 1:
Please correct "wall" to read -- walls --

Column 8, Line 20, Claim 2:
Please correct "air, containment" to read -- air containment --

Signed and Sealed this
Eighteenth Day of February, 2020

Andrei Iancu
*Director of the United States Patent and Trademark Office*